(12) United States Patent
Song

(10) Patent No.: US 6,442,097 B2
(45) Date of Patent: Aug. 27, 2002

(54) VIRTUAL CHANNEL DRAM

(75) Inventor: Dae-Sik Song, Ichon (KR)

(73) Assignee: Hyundai Electronics Industries Co., Ltd, Ichon (KR)

( * ) Notice: Subject to any disclaimer, the term of this patent is extended or adjusted under 35 U.S.C. 154(b) by 0 days.

(21) Appl. No.: 09/727,586

(22) Filed: Dec. 4, 2000

(30) Foreign Application Priority Data

Dec. 23, 1999 (KR) .............................. 99-60783

(51) Int. Cl.$^7$ ................................. G11C 8/00
(52) U.S. Cl. ................... 365/230.03; 365/201
(58) Field of Search ............... 365/201, 230.03

(56) References Cited

U.S. PATENT DOCUMENTS 6,144,587 A * 11/2000 Yoshida .................. 365/189.05

* cited by examiner

Primary Examiner—M. Tran
(74) Attorney, Agent, or Firm—Finnegan, Henderson, Farabow, Garrett & Dunner, L.L.P.

(57) ABSTRACT

In the virtual channel DRAM of the present invention, data can be transferred between one of the channels and a number of the segments in such a way to reduce test time for a whole chip. The virtual channel DRAM includes: a number of segments for dividing a cell conducted to bit line by an active command is divided into a number blocks; a number of segment selecting units for selectively conducting the bit line in one of the segments to a data transfer line; a number of channels for temporarily storing data transferred among the bit line, the data transfer line and a channel bus line; a number of channel selecting units for selectively conducting the channel bus line in one of the channels to the data transfer line; and a control signal generating unit for generating a first control signal used for selectively conducting the bit line in one of the segments to the data transfer line and used for simultaneously conducting the bit lines of all segments to the data transfer line in a predetermined external command mode.

7 Claims, 10 Drawing Sheets

VIRTUAL CHANNEL DRAM

FIELD OF THE INVENTION

The present invention relates to a virtual channel DRAM; and, more particularly, to a virtual channel DRAM capable of reducing test time for an entire chip by providing data transfer between a channel and a number of segment blocks all with a predetermined command mode.

PRIOR ART OF THE INVENTION

FIG. 1 is a diagram for explaining data transfer between segments and channels in a conventional virtual channel DRAM.

A segment is a group of memory cells, each of which is connected t o a pair of bit line bus BL/BLB by an active command, and an entire cell array are divided into a number of segments. A channel refers to a register for storing data of the whole cell array or some part thereof and they are connected to the bit line bus BL/BLB in response to the active command. In the virtual channel DRAM, the number of total bits for one segment is identical to that for one channel so that data transfer is performed between the segment and the channel.

FIG. 2 is a diagram of conventional segments 10_0 to 10_N shown in FIG. 1. The whole cells, that are connected to the bit line bus BL/BLB by the active command, are divided in to a number of blocks.

FIG. 3 is a diagram of a conventional segment selector 20 shown in FIG. 1, in which this is s electively connected to the bit line bus BL/BLB in one of the segments 10_0 to 10_N. As shown in FIG. 3, in the segment selector 20, an NMOS transistor is coupled respectively between each bit line bus BL/BLB and each data transfer bus and switched by a segment selection signal SGS<N>.

The segment selection signal SGS<2> among SGS<0>, . . . , SGS<N> transits to logic high when the bit line bus BL/BLB of a segment<0> block is connected to the data transfer bus. The segment selection signal SGS<N> transits to logic high when bit line bus BL/BLB of a segment<N> block is coupled to the data transfer bus.

FIG. 4 is a diagram of a conventional channel selector 40 shown in FIG. 1, that selectively couples a channel bus CRG/CRGB bus in one of a number of channels to the data transfer bus. As shown in FIG. 4, in the segment selector 40, a NMOS transistor is coupled between each channel bus CRG/CRGB and each data transfer bus, respectively, and switched by a channel selection signal CS<M>.

The channel selection signal CS<0> among channel selection signal CS<0>, . . . , CS<N> transits to logic high when the channel bus CRG/CRGB of a channel<0> is coupled to the data transfer bus. And the channel selection signal CS<M> transits to logic high when the channel bus CRG/CRGB of a channel<M> channel is coupled to the data transfer bus.

FIG. 5 is a diagram of conventional channels 50_0 to 50_N shown in FIG. 1, that stores temporarily data transferred among the bit line bus BL/BLB, the data transfer bus and the channel bus CRG/CRGB.

FIG. 6 is a circuit diagram of a segment selection signal (SGS) generator 30 shown in FIG. 1, that generates segment selection signal SGS<0>, . . . , SGS<N> for selectively coupling bit line bus BL/BLB in one of a number of segments and the data transfer bus;

The conventional SGS signal generator 30 includes: NAND gates NA0, NA2, . . . , to which SAB<0>, SAB<1>, . . . , SAB<K> are applied; inverters INV0, INV2, . . . , for inverting outputs of the NAND gates NAD, NA2, . . . , to provide segment selection signals SGS<0>, SGS<2>, . . . ; NAND gates NA1, NA3, . . . , to which SA<0>, SAB<1>, . . . , SAB<K>; and inverters INV1, INV3, . . . , for inverting outputs of the NAND gates NA1, NA3, . . . , to provide the segment selection signals SGS<1>, SGS<3>, . . . .

Here, segment address signals SA<0>, SAB<0>, SA<1>, SAB<1>, . . . , SA<N>, SAB<N> are applied from an external circuit for selecting the segment. The segment address signal SA<0> becomes logic high when the address signal determining logic of the segment address signals SA<0> and SAB<0> among the address signals is logic high. On the contrary, the segment address bar signal SAB<0> becomes logic high when the address signal determining logic of SA<0> and SAB<0> among the address signals is logic low.

The segment address signal SA<K> becomes logic high when the address signal determining logic of SA<K> and SAB<K> among the address signals is logic high. On the contrary, the segment address bar signal SAB<K> becomes logic high when the address signal determining logic of SA<K> and SAB<K> among the address signals is logic low.

The segment selection signal SGS<0>, which becomes logic high when the bit line bus BL/BLB of the segment<0> block is connected to the data transfer bus, becomes logic high when the segment address bar signals SAB<0>, SAB<1>, . . . , SAB<K> become logic high. And, the segment selection signal SGS<N> that becomes logic high when the bit line BL/BLB of the segment<N> block is connected to the data transfer bus becomes logic high when the segment address signals SA<0>, SA<1>, . . . , SA<K> become logic high.

A command signal BGM becomes logic high when a data transfer between the segment and the channel is performed.

However, in the data transfer between the segments and the channels in the conventional virtual channel DRAM, one of the segments always corresponds to one of the channels. Therefore, the command for data transfer from the channel to the segment should be inputted N times to transfer data from one channel to N segments.

SUMMARY OF THE INVENTION

Therefore, it is an object of the present invention to provide a virtual channel DRAM capable of reducing chip test time by configuring logic in such a way to simultaneously transfer data from a channel to N segments with a predetermined external command input.

In accordance with an aspect of the present invention, there is provided a virtual channel DRAM comprising; a number of segments for dividing a cell coupled to bit line by an active command is divided into a number blocks; a number of segment selecting units for selectively coupling the bit line in one of the segments to a data transfer bus; a number of channels for temporarily storing data transferred among the bit line, the data transfer bus and a channel bus line; a number of channel selecting units for selectively coupling the channel bus line in one of the channels to the data transfer bus; and a control signal generating unit for generating a first control signal used for selectively coupling the bit line in one of the segments to the data transfer bus and used for simultaneously coupling the bit lines of all segments to the data transfer bus in a predetermined external command mode.

The control signal generating unit includes: even order NAND gates at input stage, to each of which address signals applied from external to select one of the segments and a second control signal; odd order NAND gates at input stage, to each of which the address signals applied from external to select one of the segments and the second control signal; even order NAND gates at output stage, to each of which outputs of the even order NAND gates at the input stage and a third control signal and each of which provides the first control signal; and odd order NAND gates at output stage, to each of which outputs of the odd order NAND gates at the input stage and the third control signal and each of which provides the first control signal.

The second control signal becomes logic high when a command corresponding to data transfer between the segments and the channels is applied.

The third control signal becomes logic high in an external command mode for a predetermined test in which data is transferred from the channels to the segments.

In accordance with another aspect of the present invention, there is provided a virtual channel DRAM comprising; a number of segments for dividing a cell coupled to a bit line by an active command into a number of blocks; a segment selecting unit for selectively coupling the bit line in one of the segments to a data transfer bus and for selectively coupling the bit lines in all segments to the data transfer bus in a predetermined external command mode; a number of channels for temporarily storing data transferred among the bit line, the data transfer bus and a channel bus line; a number of channel selecting units for selectively coupling the channel bus line in one of the channels to the data transfer bus; and a control signal generating unit for generating a control signal for selectively coupling the bit line in one of the segments to the data transfer bus.

The segment selecting unit includes transfer gates, each coupled between the bit line of each segment and the data transfer bus and switched by the control signal selecting one of the segments and a signal, wherein the signal being logic high in an external command mode for a predetermined test in which data should be transferred from the channels to the segments. The transfer gates can be implemented with NMOS transistors.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

In the accompanying drawings, elements having identical functions are referred as an identical reference notation and, for the sake of simplicity, repeated description for each of them will be omitted.

Figure 1:
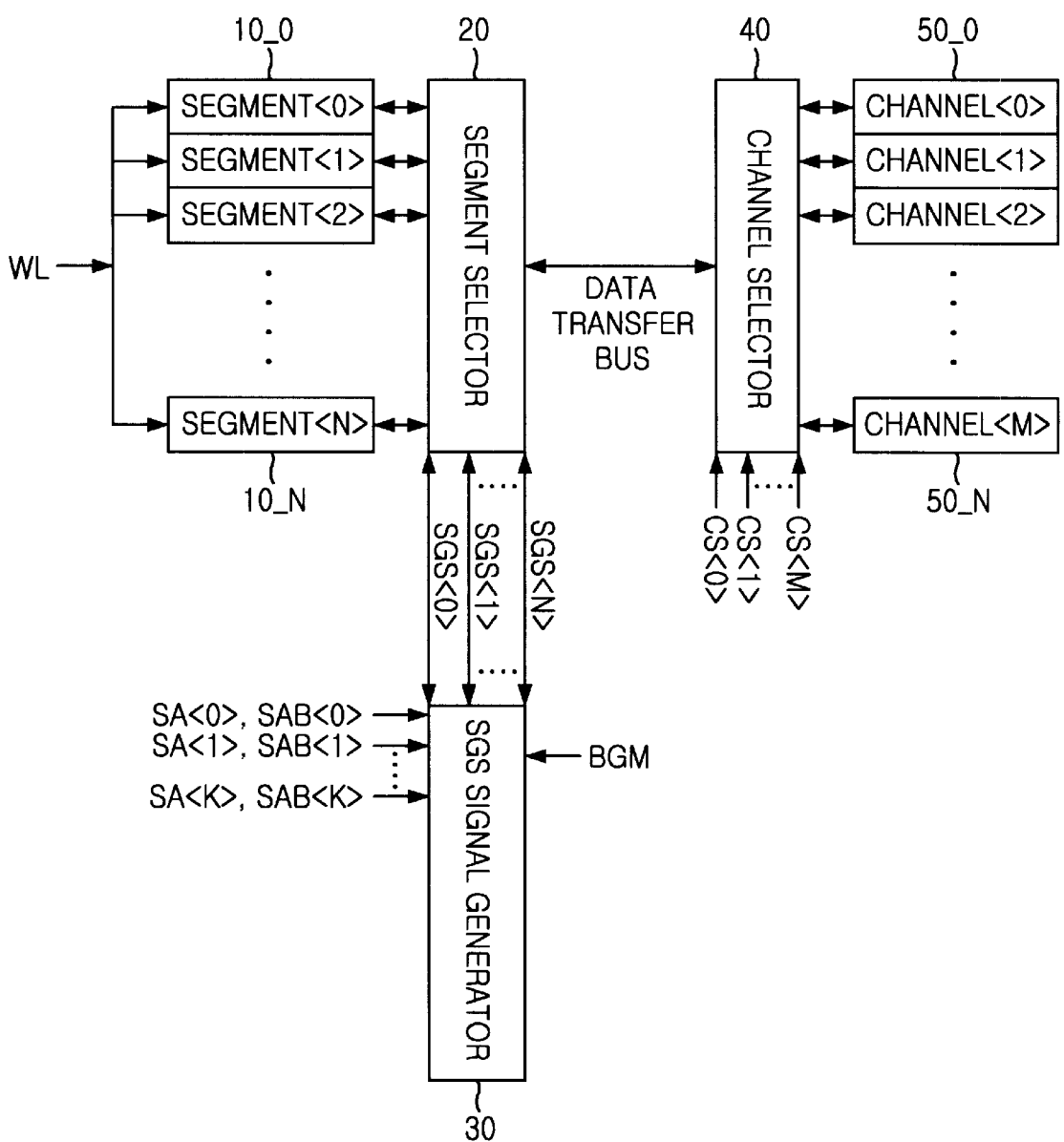
FIG. 1 is a diagram for explaining data transfer between segments and channels in a conventional virtual channel DRAM.
Figure 7:
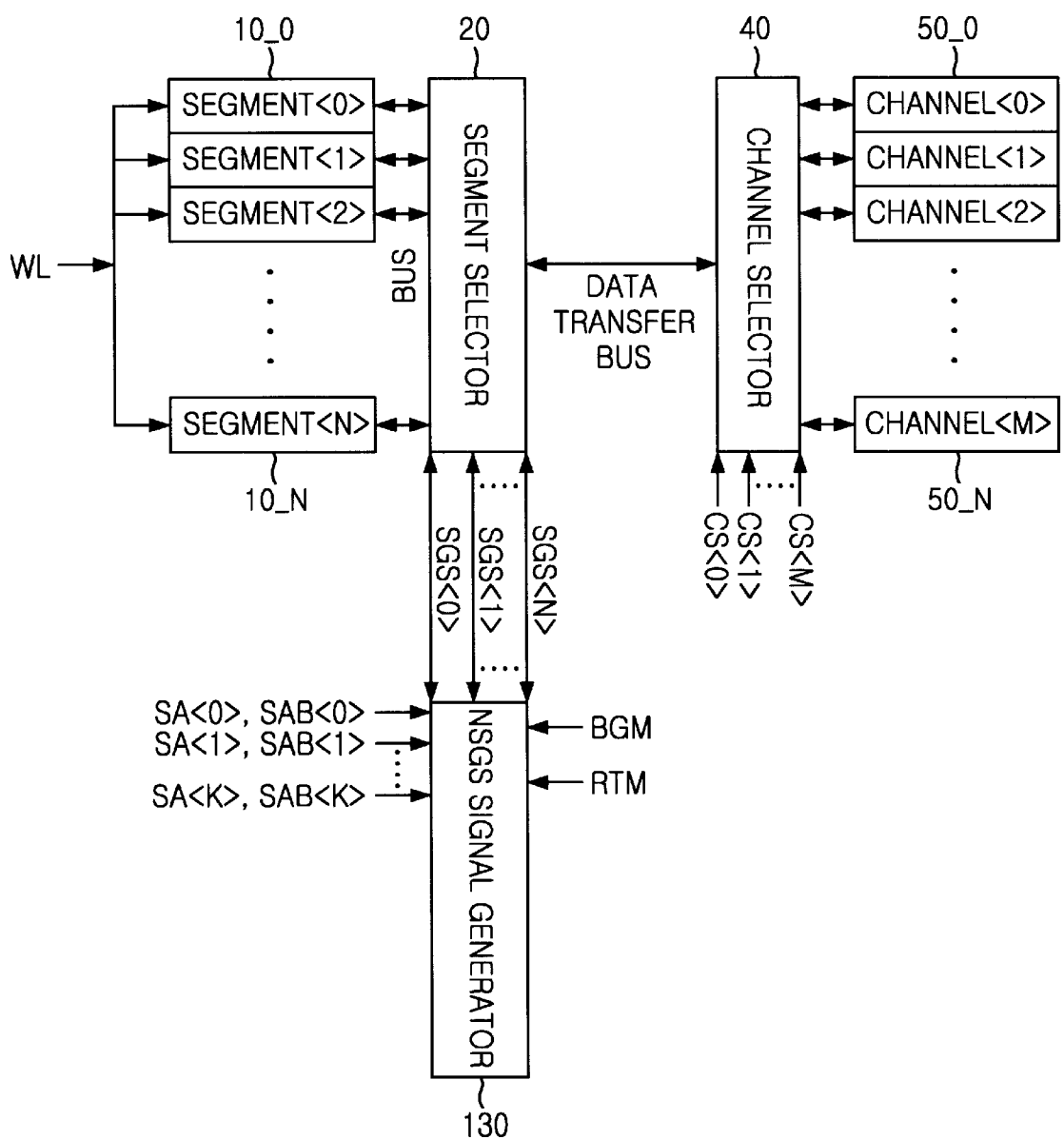
FIG. 7 is a diagram for explaining data transfer between segments and channels in a virtual channel DRAM of the present invention.

FIG. 7 is a diagram for explaining data transfer between segments and channels in a virtual channel DRAM of the present invention. FIG. 7 is similar to FIG. 1 except that signal segment selection signal (NSGS) generator 130 replaces the SGS control signal generator 30. The NSGS control signal generator 130 generates a control signal for simultaneously coupling bit line buses BL/BLB of a number of segments 10_0–10_N to a data transfer bus with a predetermined external command.

Figure 2:
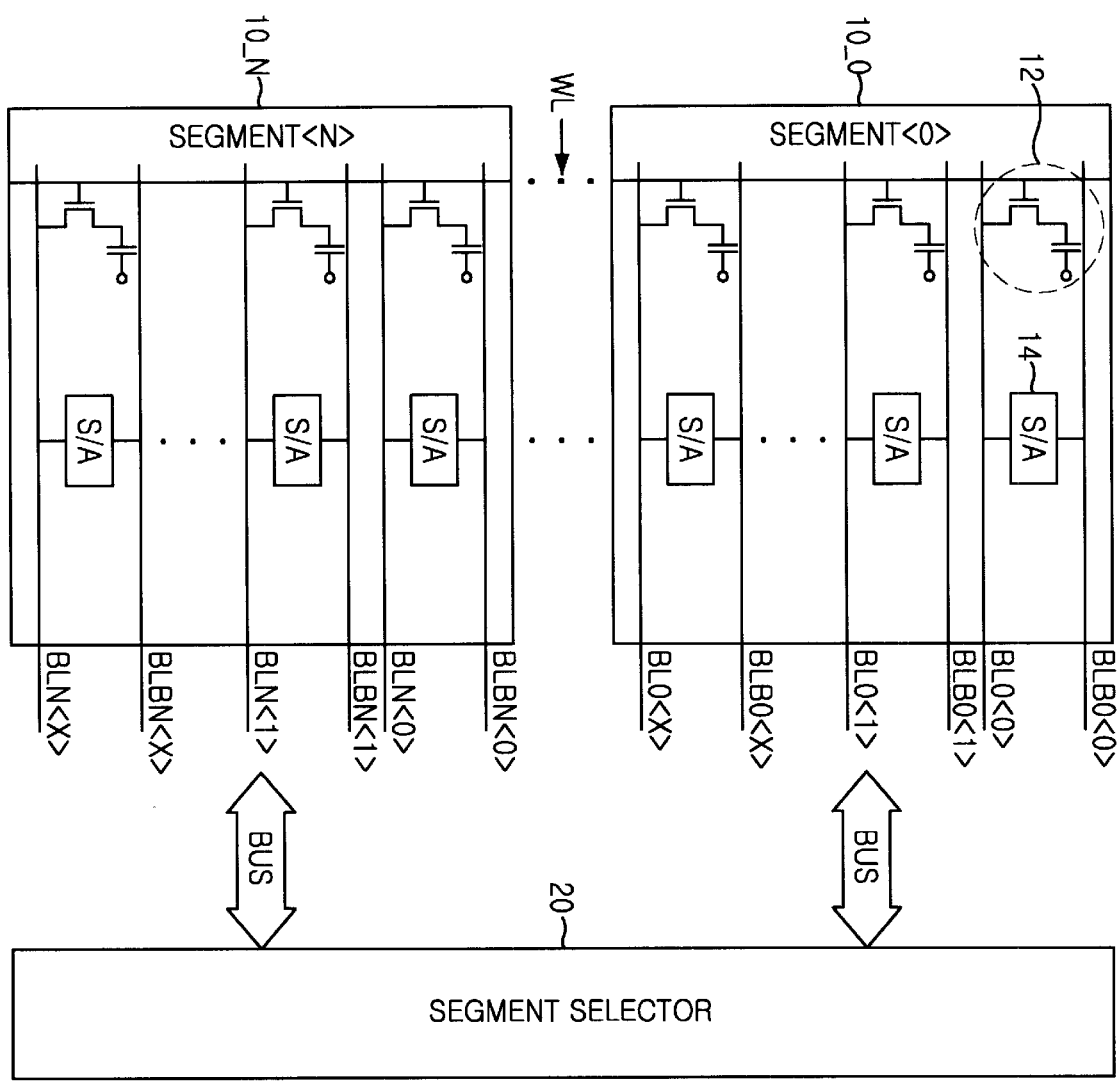
FIG. 2 is a diagram of a conventional segment shown in FIG. 1.

And, in FIG. 7, a number of the segments 10_0 to 10_N for dividing the whole cell coupled to the bit line buses BL/BLB by the active command into a number of blocks are as similar to those as shown in FIG. 2.

Figure 3:
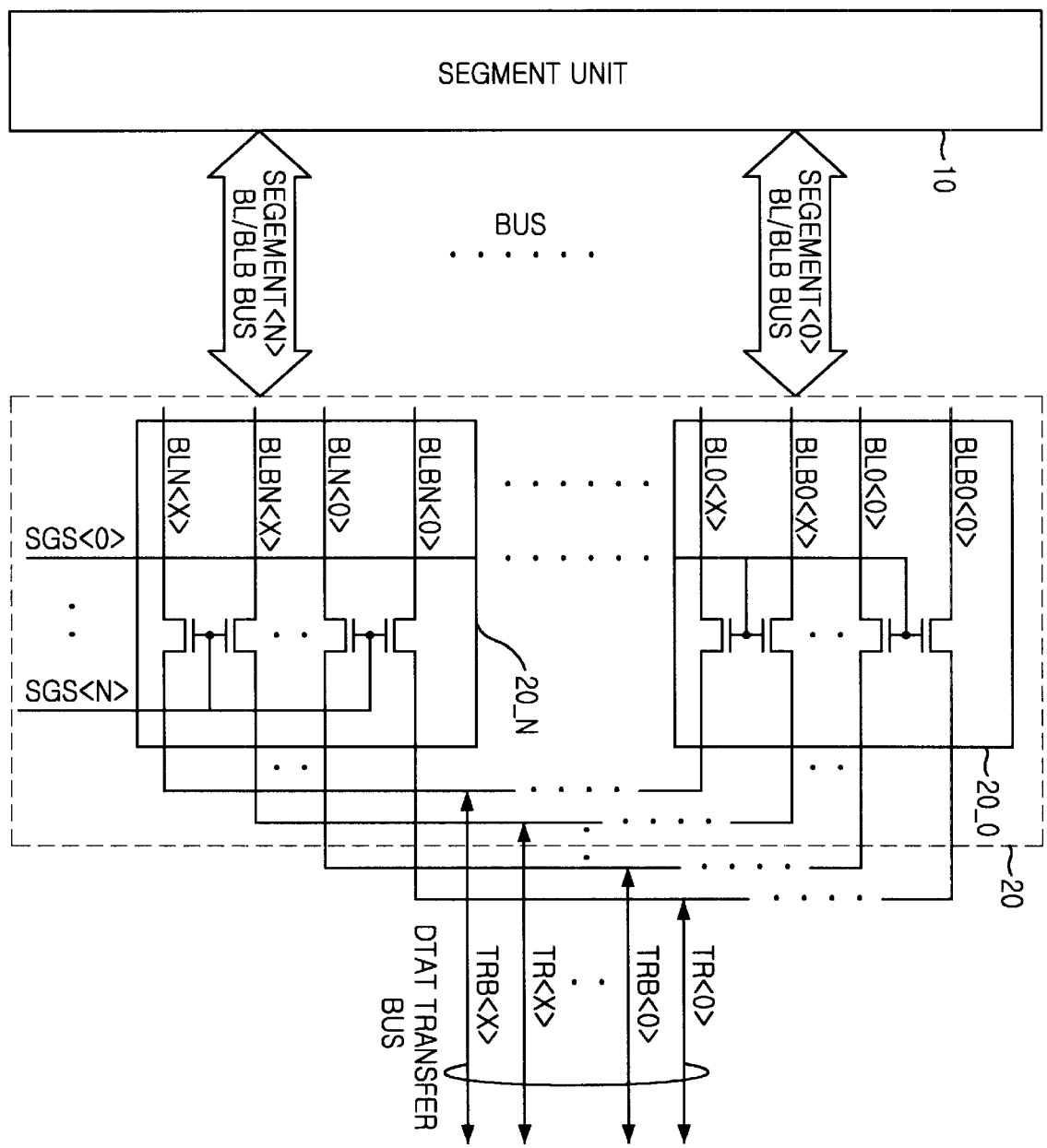
FIG. 3 is a diagram of a conventional segment selector shown in FIG. 1.

And, in FIG. 7, a plurality of segment selectors 20 for selectively coupling the bit line buses BL/BLB in one of the segments 10_0 to 10_N to the data transfer bus are similar to those as shown in FIG. 3.

A segment selection signal SGS<0> among the SGS<0>, . . . , SGS<N> becomes logic high when the bit line bus BL/BLB of a segment<0> block are coupled to the data transfer bus. And the segment selection signals GS<0>, . . . , SGS<N> simultaneously are made logic high in an external command mode so that the bit line bus BL/BLB of all the segments are coupled to the data transfer bus, simultaneously.

Figure 4:
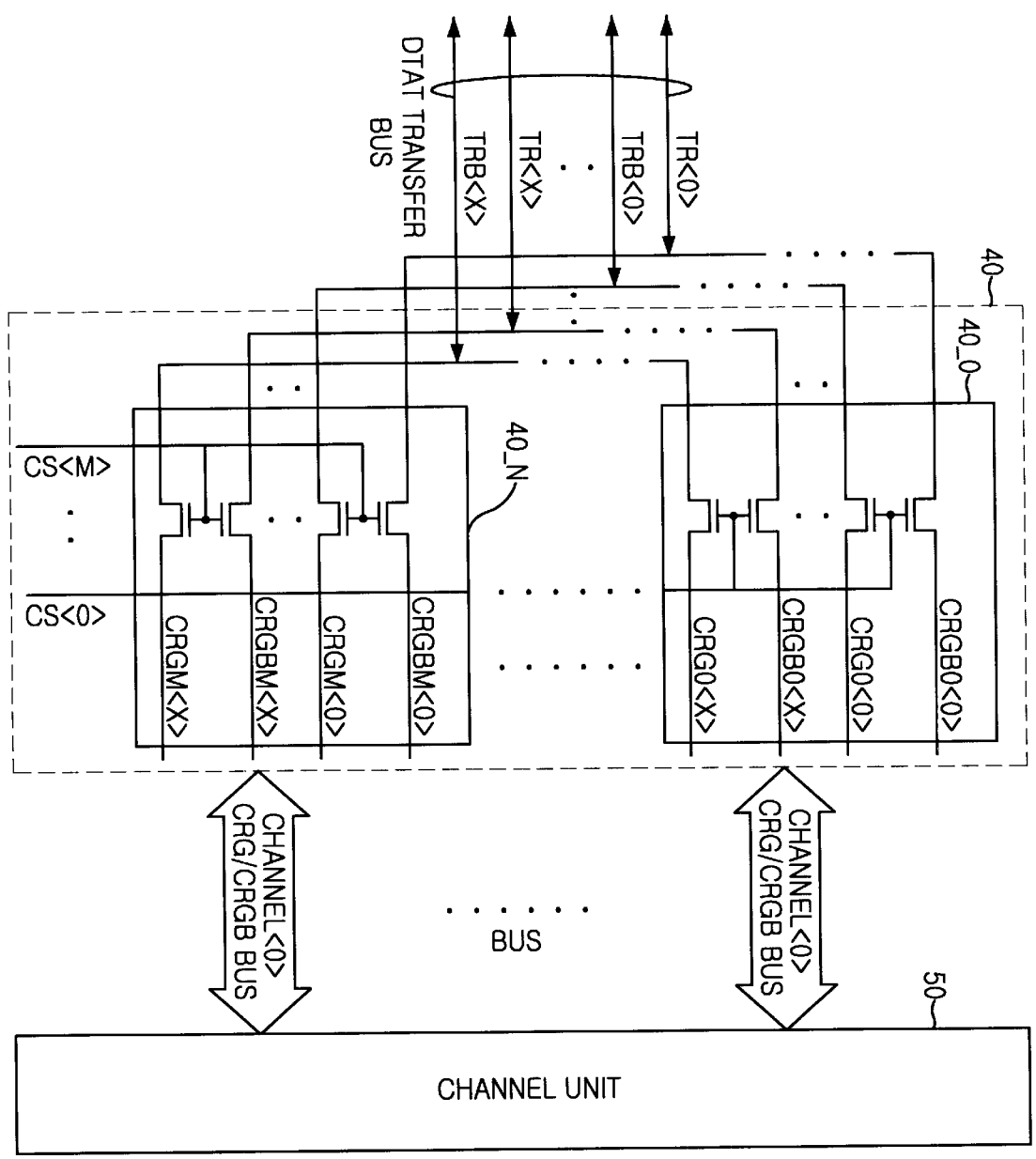
FIG. 4 is a diagram of a conventional channel selector shown in FIG. 1.

And, in FIG. 7, the plurality of channel selectors 40 for selectively coupling a channel bus CRG/CRGB in one of the channels to the data transfer bus are similar to those as shown in FIG. 4. A channel selection signal CS<0> among the signals CS<0> to CS<M> becomes logic high when of the channel bus CRG/CRGB of a channel<0> is coupled to the data transfer bus and the channel selection signal CS<M> becomes logic high when the of channel bus CRG/CRGB of a channel<M> is coupled to the data transfer bus.

Figure 5:
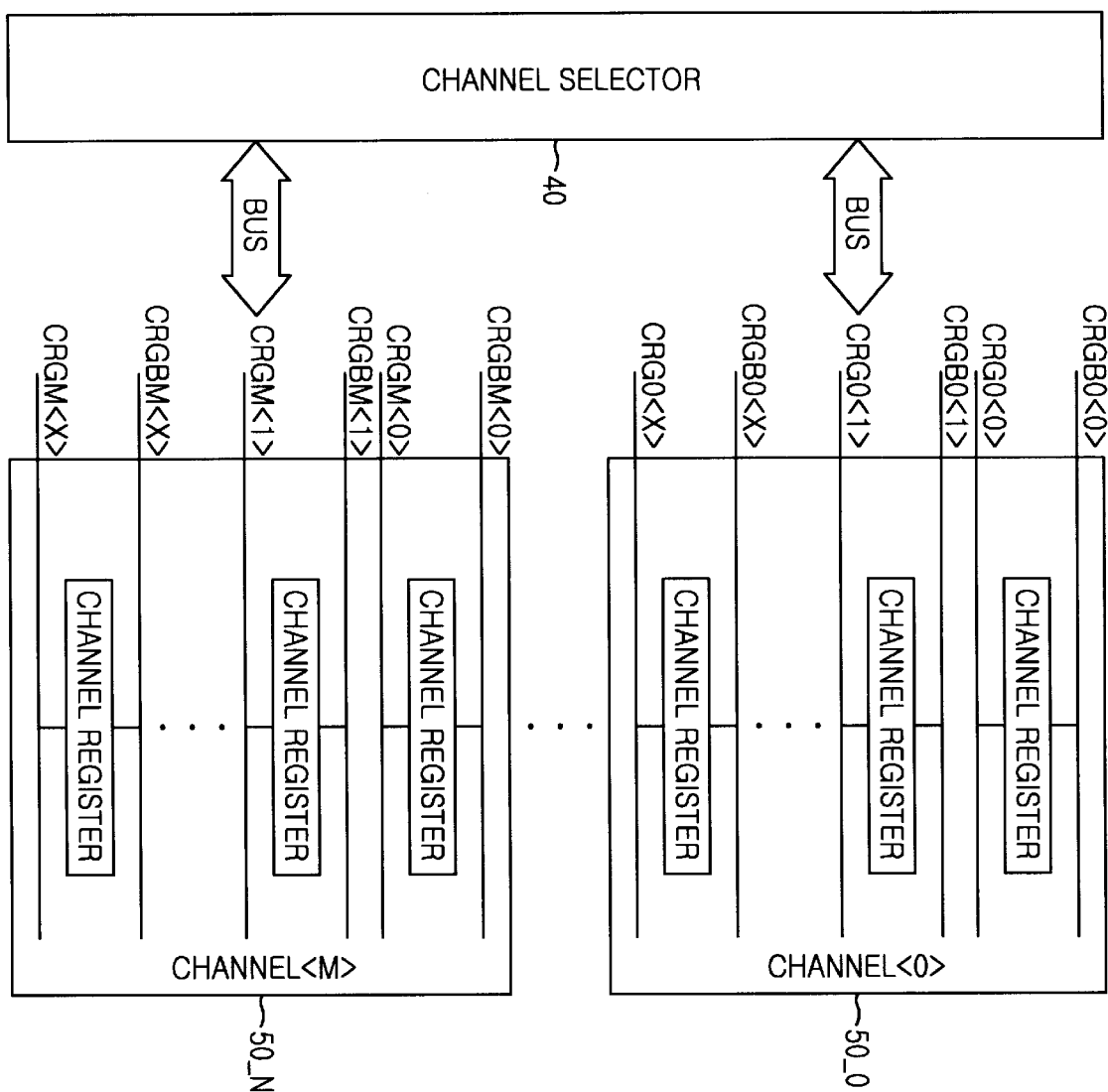
FIG. 5 is a diagram of a conventional channel shown in FIG. 1.

And, in FIG. 7, a number of channels 50_0 to 50_N temporarily storing data transferred between the bit line bus BL/BLB, the data transfer bus and the channel bus lines CRG/CRGB are similar to those as shown in FIG. 5.

Figure 8:
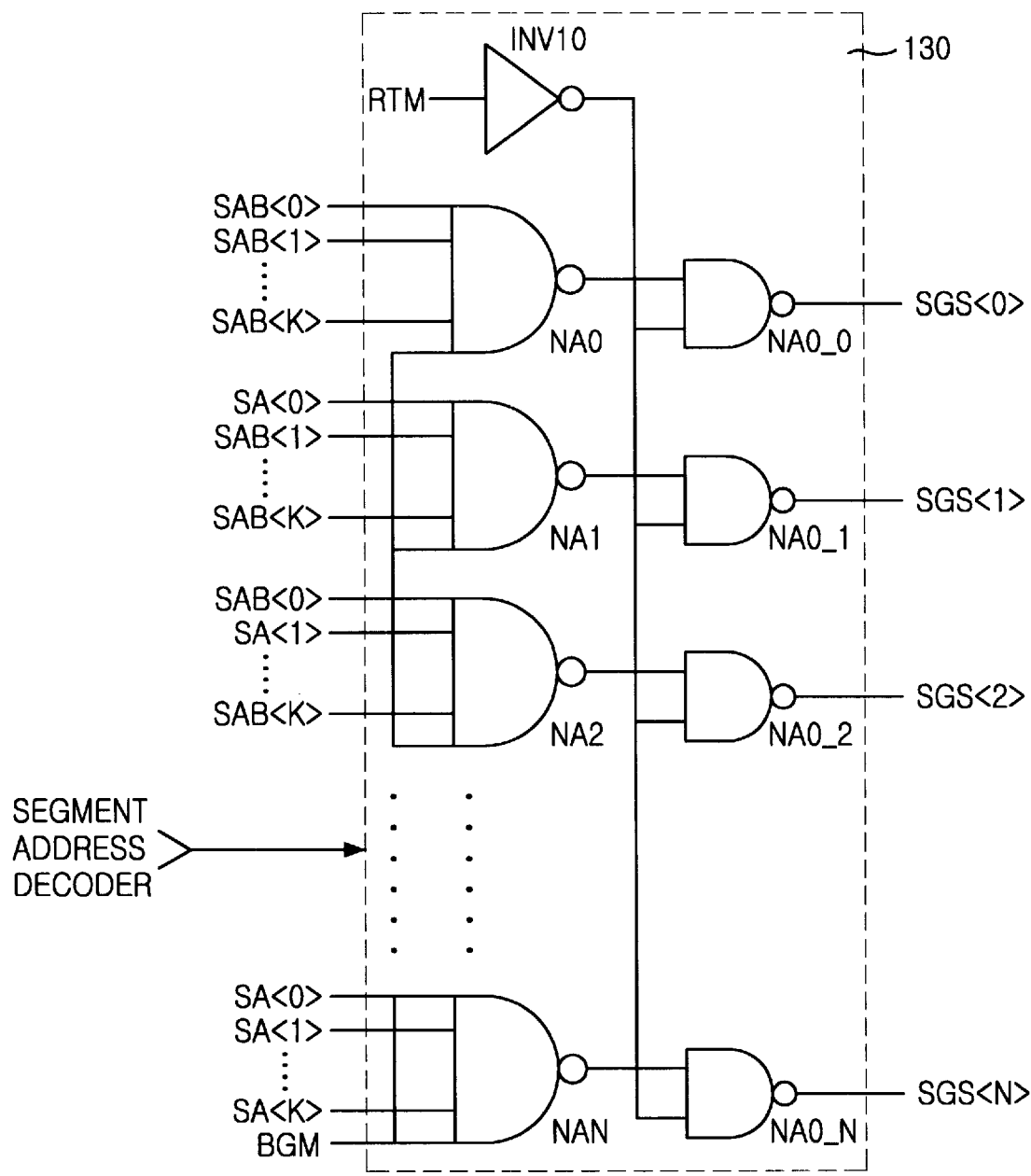
FIG. 8 is a circuit diagram of an NSGS signal generator shown in FIG. 7.

FIG. 8 is a circuit diagram of the NSGS signal generator 130 shown in FIG. 7. The NSGS signal generator 130 selectively couples the bit line bus BL/BLB in one of the segments to the data transfer bus or selectively couples the bit line bus BL/BLB in the segments to the data transfer bus in the predetermined external command mode, simultaneously.

The NSGS generator 130 includes: NAND gates NA0, NA2, . . . , to which the SAB<0>, SAB<1>, . . . , SAB<K> and the BGM signals are applied; NAND gates NA0_0, NA0_2, . . . , to which outputs of the even order NAND gates NA0, NA2, . . . and the inverted RTM signal are applied; NAND gates NA1, NA3, . . . , to which the SA<0>, SA<1>, . . . , SAB<1>, SAB<2>, . . . , and the BGM signal are applied; and NAND gates NA0_1, NA0_3, . . . , to which outputs of the odd order NAND gates NA1, NA3, . . . and the inverted RTM signal are applied in order to provide the SGS<1>, SGS<3>, . . . .

Segment address signals SA<0>, SAB<0>, SA<1>, SAB<1>, ..., SA<N>, SAB<N> signals are applied from an external circuit for selecting the segment. The segment address signal SA<0> becomes logic high when the address signal determining logic of the segment address signal SA<0> and the segment address bar signal SAB<0> among the address signals is logic high. On the contrary, the segment address bar signal SAB<0> becomes logic high when the address signal determining logic of the segment address signal SA<0> and the segment address bar signal SAB<0> among the address signals is logic low.

The segment address signal SA<K> becomes logic high when the address signal determining logic of the segment address signal SA<K> and the segment address bar signal SAB<K> among the address signals is logic high. On the contrary, the SAB<K> becomes logic high when the address signal determining logic of the segment address bar signal SA<K> and the SAB<K> among the address signals is logic low.

The segment selection signal SGS<0> that becomes logic high when the bit bus line bus BL/BLB of the segment <0> block is coupled to the data transfer bus becomes logic high when the segment address bar signals SAB<0>, SAB<1>, ..., SAB<K> become logic high. And the segment selection signal SGS<N> that becomes logic high when the bit line bus BL/BLB of the segment<N> block is coupled to the data transfer bus becomes logic high when the segment address signals SA<0>, SA<1>, ..., SA<K> become logic high.

A control signal RTM becomes logic high in an external command mode for a particular test in which data should be transferred from the channels to the segments. When the control signal RTM becomes logic high, all of the segment selection signals SGS<0>, ..., SGS<N> for coupling the bit line buses BL/BLB of the segments to the data transfer bus become logic high.

A control signal BGM becomes logic high when a command for data transfer between the segment and the channel.

Figure 9:
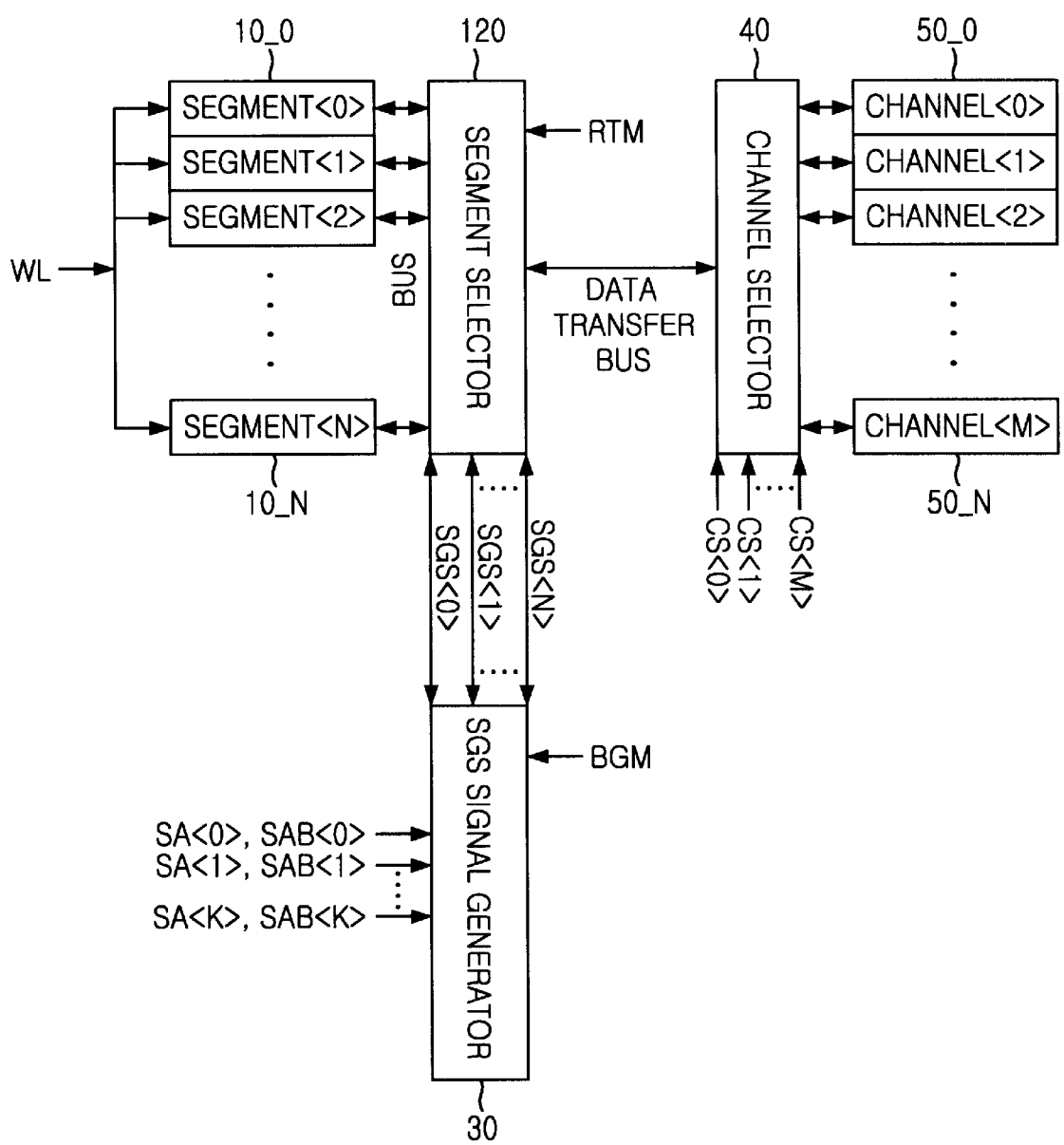
FIG. 9 is a diagram for explaining another embodiment of data transfer between segments and channels in the virtual channel DRAM of the present invention.

FIG. 9 is a diagram for explaining another embodiment of data transfer between segments and channels in the virtual channel DRAM of the present invention. FIG. 9 is similar to FIG. 1 except that a segment selector 120 replaces a segment selector 20. The segment selector 120 simultaneously couples the bit line bus BL/BLB in one of the segments to the data transfer bus or for selectively coupling the bit line bus BL/BLB in the segments to the data transfer bus.

Figure 10:
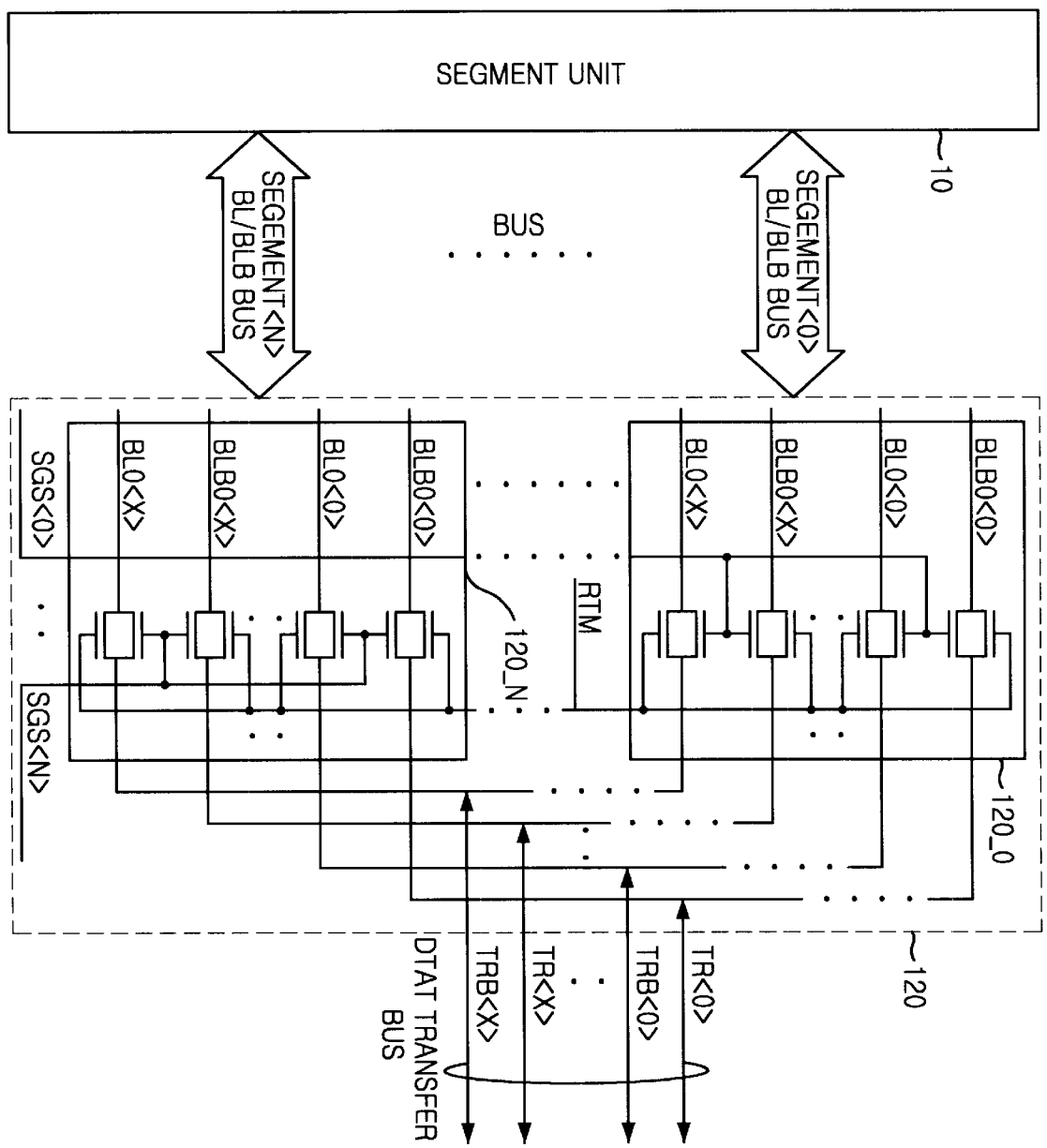
FIG. 10 is a diagram of an embodiment of a segment selector 120 shown in FIG. 9.

At first, as shown in FIG. 10, the segment selector 120 is coupled between the bit line bus BL/BLB of the segments and the data transfer bus and includes transfer gates, each switched by the segment selection signals SGS<0>, ..., SGS<N> for selecting one of the segments and the control signal RTM.

The signal segment selection signal SGS<0> among the SGS<0>, ..., SGS<N> that becomes logic high when the bit line BL/BLB of the segment<0> block is coupled to the data transfer bus becomes logic high. On the contrary, the segment selection signal SGS<N> signal that becomes logic high when the bit line BL/BLB of the segment<N> block is coupled to the data transfer bus.

RTM signal becomes logic high in the external command mode for a particular test in which data should be transferred from the channels to the segments. When the control signal RTM becomes logic high, the bit line buses BL/BLB of the segments are coupled to the data transfer bus.

In FIG. 9, a number of segments 10_0 to 10_N for dividing the whole cell coupled to the bit line buses BL/BLB by an active command are similar to those as shown in FIG. 2.

And, in FIG. 9, a plurality of channel selector 40 for selectively coupling the channel bus CRG/CRGB in one of the channels to the data transfer bus are similar to those as shown in FIG. 4. The channel selection signal CS<0> among the channel selection signals CS<0>, ..., CS<M> becomes logic high when the channel bus CRG/CRGB of the channel <0> is coupled to the data transfer bus.

And, in FIG. 9, a number of channels 50_0 to 50_N for temporarily storing data transferred between the bit line buses BL/BLB, the data transfer bus and the channel bus CRG/CRGB are similar to those as shown in FIG. 5.

Figure 6:
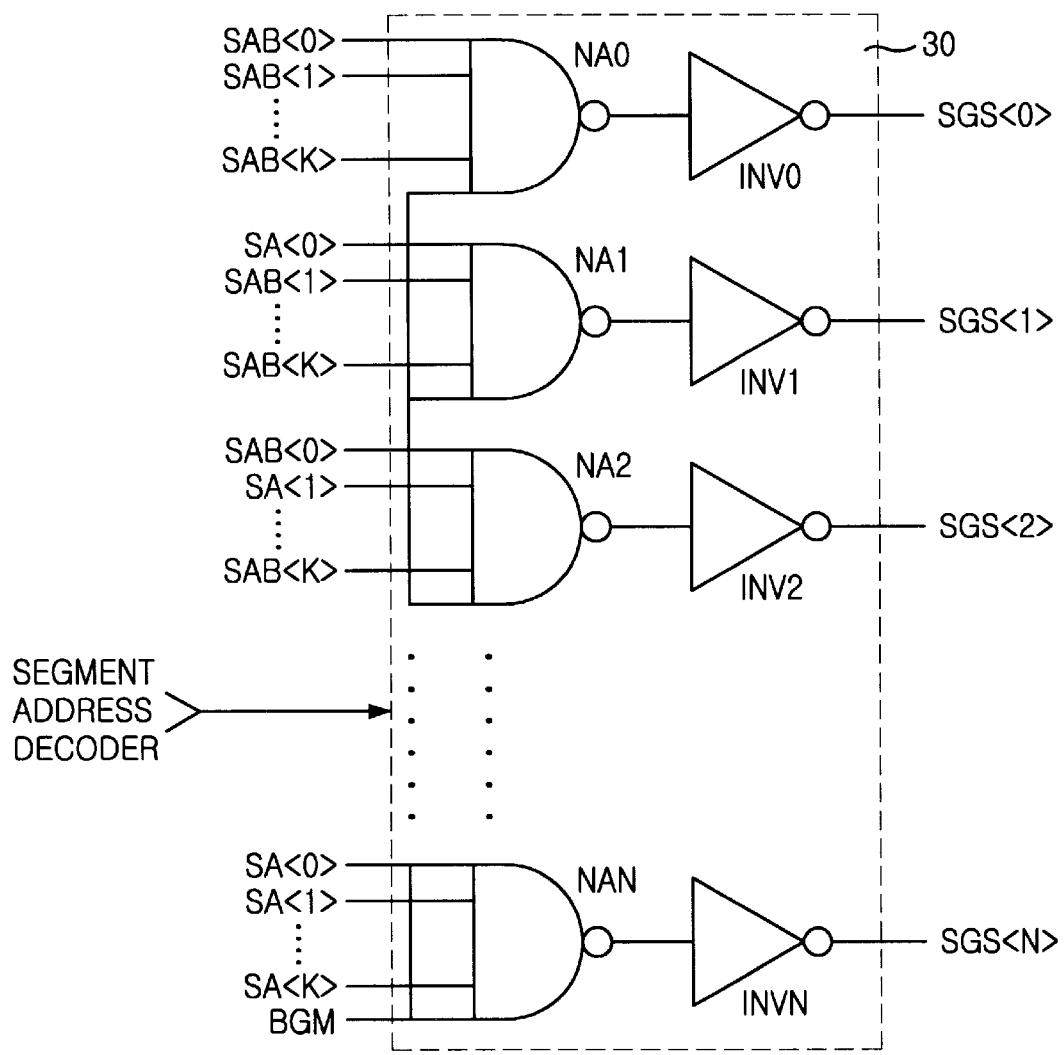
FIG. 6 is a circuit diagram of an SGS signal generator 30 shown in FIG. 1.

And, in FIG. 9, SGS signal generator 30 for selectively coupling the bit line bus BL/BLB in one of the segments to the data transfer bus is similar to that as shown in FIG. 6.

The segment address signals SA<0>, SAB<0>, SA<1>, SAB<1>, ..., SA<N>, SAB<N>s are applied from external for selecting the segment. The segment address signal SA<0> becomes logic high when the address signal determining logic of the segment address signal SA<0> and among the address signals is logic high. On the contrary, the segment address signal bar SAB<0> becomes logic high when the address signal determining logic of the segment address signal SA<0> among the address signals is logic low.

The segment address signal SA<K> becomes logic high when the address signal determining logic of the segment selection bar signal SAB<K> among the address signals is logic high. On the contrary, the segment selection bar signal SAB<K> becomes logic high when the address signal determining logic of the segment selection bar signal SA<K> and the among address signals is logic low.

The segment selection signal SGS<0> that becomes logic high when the bit line bus BL/BLB of the segment<0> block is coupled to the data transfer bus becomes logic high when segment address bar signals SAB<0>, SAB<1>, ..., SAB<K> become logic high. The segment selection signal SGS<N> that becomes logic high when the bit line BL/BLB of the segment block of segment <N> block is coupled to the data transfer bus becomes logic high when the segment address signals SA<0>, SA<1>, ..., SA<K> become logic high.

The control signal BGM becomes logic high when a command for data transfer between the segment and the channel.

As described above, in the conventional virtual channel DRAM, the cell coupled to the bit line bus BL/BLB by the active command is divided into a number blocks and data is transferred between one of the channels and one of the segments.

In the virtual channel DRAM of the present invention, data can be transferred between one of the channels and a number of the segments in such a way to reduce test time for a whole chip.

While the present invention has been shown and described with respect to the particular embodiments, it will be apparent to those skilled in the art that many changes and modifications may be made without departing from the spirit and scope of the invention as defined in the appended claims.

What is claimed is:

1. A virtual channel DRAM comprising:
   a number of segments having a plurality of memory cells which are coupled to bit lines in response to an active command, wherein the number of segments form a memory array a number of segment selecting means for selectively conducting a bit line in one of the segments to a data transfer line;

a number of channels for temporarily storing data transferred among the bit line, the data transfer line and a channel bus line;

a number of channel selecting means for selectively conducting the channel bus line in one of the channels to the data transfer line; and control signal generating means for receiving segment address signals and for generating a first control signal used for selectively conducting the bit line in one of the segments to the data transfer line or used for simultaneously conducting the bit lines of all segments to the data transfer line in a predetermined external command mode.

2. The virtual channel DRAM as recited in claim 1, wherein the control signal generating means includes:

first even order NAND gates at input stage, to each of which address signals applied from external to select one of the segments and a second control signal;

second odd order NAND gates at input stage, to each of which the address signals applied from external to select one of the segments and the second control signal;

second even order NAND gates at output stage, to each of which outputs of the even order NAND gates at the input stage and a third control signal and each of which provides the first control signal; and second odd order NAND gates at output stage, to each of which outputs of the odd order NAND gates at the input stage and the third control signal and each of which provides the first control signal.

3. The virtual channel DRAM as recited in claim 2, wherein the second control signal becomes logic high when a command corresponding to data transfer between the segments and the channels is applied.

4. The virtual channel DRAM as recited in claim 2, wherein the third control signal becomes logic high in an external command mode for a predetermined test in which data is transferred from the channels to the segments.

5. A virtual channel DRAM comprising:

a number of segments having a plurality of memory cells which are coupled to bit lines in response to an active command, wherein the number of segments form a memory cell array;

segment selecting means for selectively conducting a bit line in one of the segments to a data transfer line and for selectively conducting the bit lines in all segments to the data transfer line in a predetermined external command mode;

a number of channels for temporarily storing data transferred among the bit line, the data transfer line and a channel bus line;

a number of channel selecting means for selectively conducting the channel bus line in one of the channels to the data transfer line;

control signal generating means for receiving segment address signals and for generating a control signal for selectively conducting the bit line in one of the segments to the data transfer line.

6. The virtual channel DRAM as recited in claim 5, wherein the segment selecting means includes transfer gates, each coupled between the bit line of each segment and the data transfer line and switched by the control signal selecting one of the segments and a signal, wherein the signal being logic high in an external command mode for a predetermined test in which data should be transferred from the channels to the segments.

7. The virtual channel DRAM as recited in claim 6, wherein the transfer gates respectively includes NMOS transistors.

* * * * *